US011609256B2

(12) United States Patent
Dunnihoo

(10) Patent No.: US 11,609,256 B2
(45) Date of Patent: Mar. 21, 2023

(54) FIELD COLLAPSE PULSER

(71) Applicant: Pragma Design, Inc., Bertram, TX (US)

(72) Inventor: Jeffrey C. Dunnihoo, Bertram, TX (US)

(73) Assignee: Pragma Design, Inc., Bertram, TX (US)

( * ) Notice: Subject to any disclaimer, the term of this patent is extended or adjusted under 35 U.S.C. 154(b) by 130 days.

(21) Appl. No.: 17/320,972

(22) Filed: May 14, 2021

(65) Prior Publication Data

US 2021/0356505 A1 Nov. 18, 2021

Related U.S. Application Data

(60) Provisional application No. 63/178,248, filed on Apr. 22, 2021, provisional application No. 62/704,581, filed on May 16, 2020.

(51) Int. Cl.
*G01R 31/00* (2006.01)
*G01R 31/28* (2006.01)
(52) U.S. Cl.
CPC ....... *G01R 31/002* (2013.01); *G01R 31/2841* (2013.01)
(58) Field of Classification Search
CPC ...... G01R 15/16; G01R 15/165; G01R 31/00; G01R 31/002; G01R 31/28; G01R 31/12; G01R 31/08; G01R 31/2841; G01R 29/12; G01R 5/28
See application file for complete search history.

(56) References Cited

U.S. PATENT DOCUMENTS

| 9,726,707 B1* | 8/2017 | Barth ................. G01R 31/2855 |
| 10,591,526 B1* | 3/2020 | Chowdhury .......... G06F 30/398 |
| 2001/0056340 A1* | 12/2001 | Gorin ................... G01R 31/002 703/14 |
| 2019/0391182 A1 | 12/2019 | Dunnihoo et al. |
| 2020/0356332 A1* | 11/2020 | Bamba ................ G06F 3/1423 |

FOREIGN PATENT DOCUMENTS

JP 2003121493 A * 4/2003

OTHER PUBLICATIONS

P. Tamminen, T. Viheriäkoski, T. Reinvuo, L. Sydänheimo and L. Ukkonen, "Field collapse event ESD test method," Electrical Overstress/Electrostatic Discharge Symposium Proceedings 2014, Tucson, AZ, 2014, pp. 1-6.
J. Dunnihoo, P. Tamminen, T. Viheriäkoski, "Near Field EMC Scanning Method Based on an EField Collapse," Proc 41st Int'l Symp for Testing and Failure Analysis, Portland, Oregon, Nov. 1-5, 2015.
Human Body Model (HBM) vs. IEC 61000-4-2; Semiconductor Components Industries, LLC, Sep. 2010—Rev. 0; Publication Order No. TND410/D; 7 pages.
Texas Instruments Application Report; SLVA954; ISO 10605 Road Vehicles Test Methods for Electrical Disturbances from Electrostatis Discharge; Jul. 2018; www.ti.com; 6 pages.

* cited by examiner

*Primary Examiner* — Son T Le
(74) *Attorney, Agent, or Firm* — Harness, Dickey & Pierce, P.L.C.; Anthony Fussner

(57) ABSTRACT

Disclosed are exemplary embodiments of electrostatic discharge (ESD) pulse generators that may provide improved system level ESD robustness characterization and qualification analysis.

21 Claims, 13 Drawing Sheets

FIELD COLLAPSE PULSER

CROSS-REFERENCE TO RELATED APPLICATIONS

This application claims priority to and the benefit of U.S. Provisional Application No. 62/704,581 filed May 16, 2020 and U.S. Provisional Application No. 63/178,248 filed Apr. 22, 2021. The entire disclosures of the above applications are incorporated herein by reference.

FIELD

The present disclosure relates to transient pulsers, including electrostatic discharge (ESD) pulse generators (e.g., field collapse pulsers).

BACKGROUND

This section provides background information related to the present disclosure which is not necessarily prior art.

The International Electrotechnical Commission (IEC) 61000-4-2 immunity standard and variants thereof (e.g., International Organization for Standardization (ISO) 10605 standard used to test immunity compliance of electronic components in automotive applications, etc.) are the primary system level electrostatic discharge (ESD) qualification emulation tool, sine qua non. Industry and regulatory requirements the world over dictate product robustness and acceptance standards based on this Human Metal Model "gun" testing.

DRAWINGS

The drawings described herein are for illustrative purposes only of selected embodiments and not all possible implementations, and are not intended to limit the scope of the present disclosure.

Figure 10:
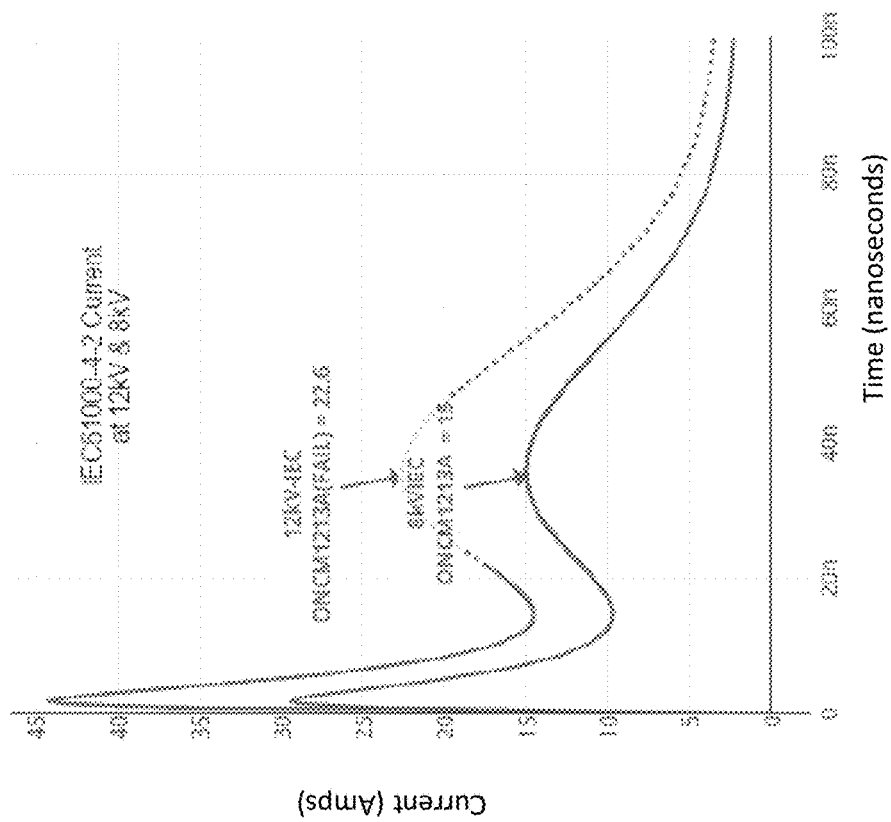

FIG. 10 is a line graph of IEC61000-4-2 Current in Amps (A) at 12 kV and 8 kV versus time in nanoseconds (ns), and showing 22.6 A for 12 kV IEC into a typical 7V TVS.

Figure 11:
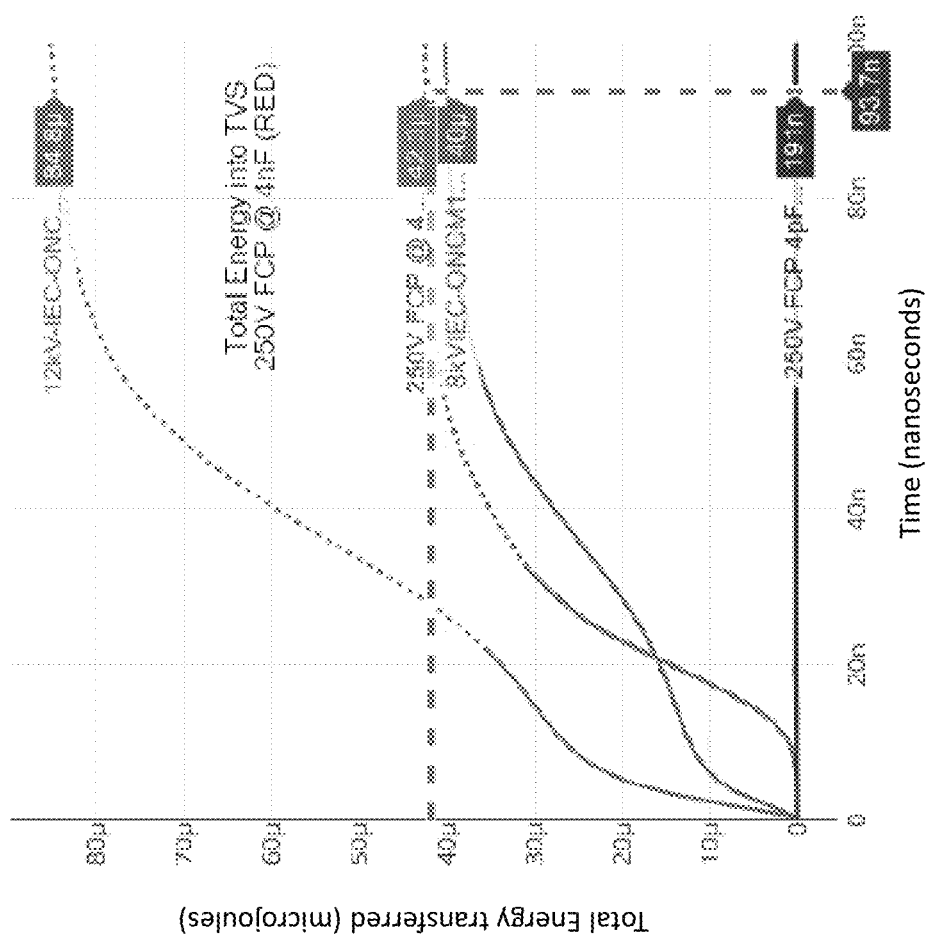

FIG. 11 is a line graph of total energy transferred in microjoules versus time in nanoseconds (ns), and showing total energy into TVS 250V FCP at 4 nF capacitance.

Figure 6:
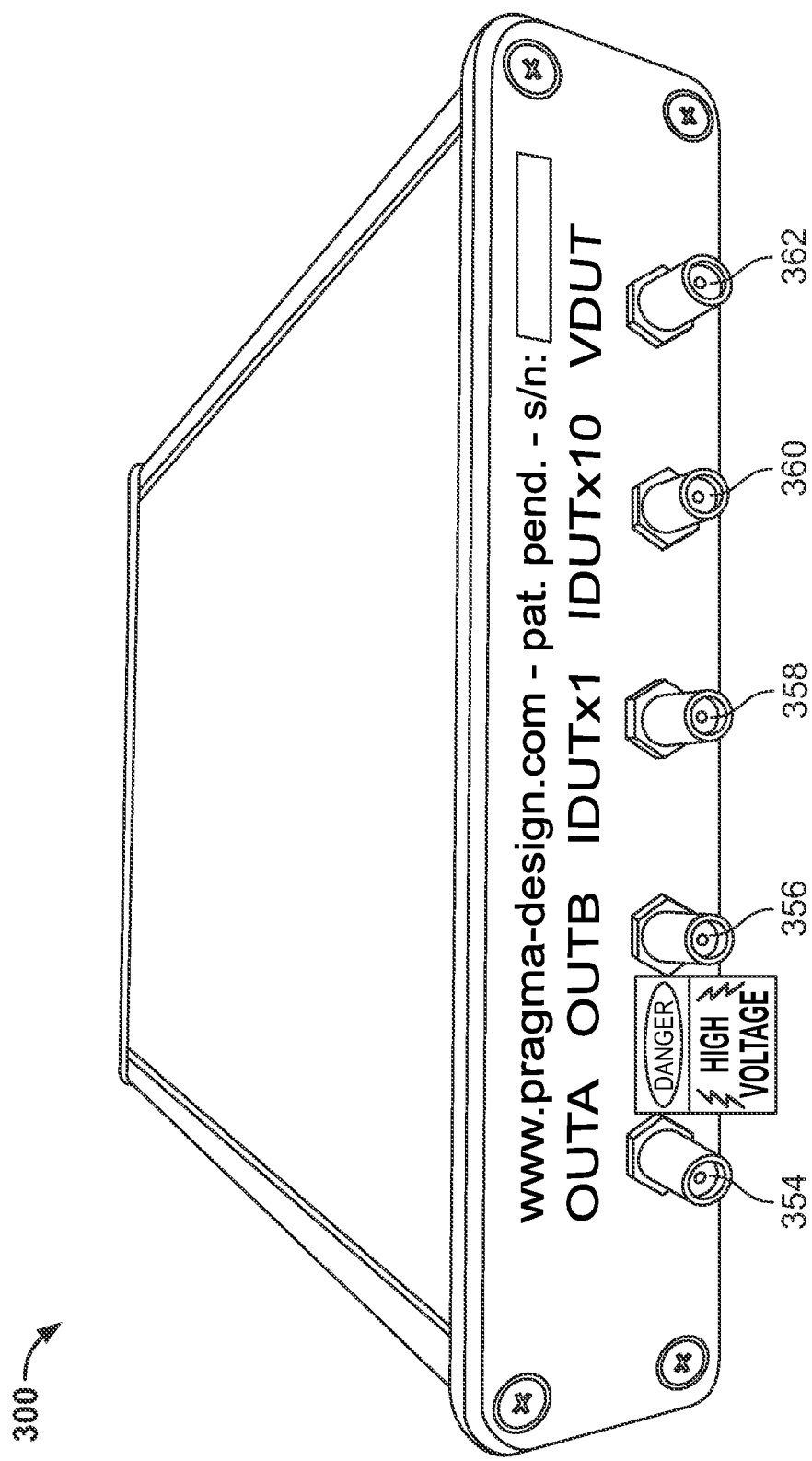
FIG. 6 illustrates the back panel connections or ports of the field collapse pulser shown in FIG. 4.
Figure 12:
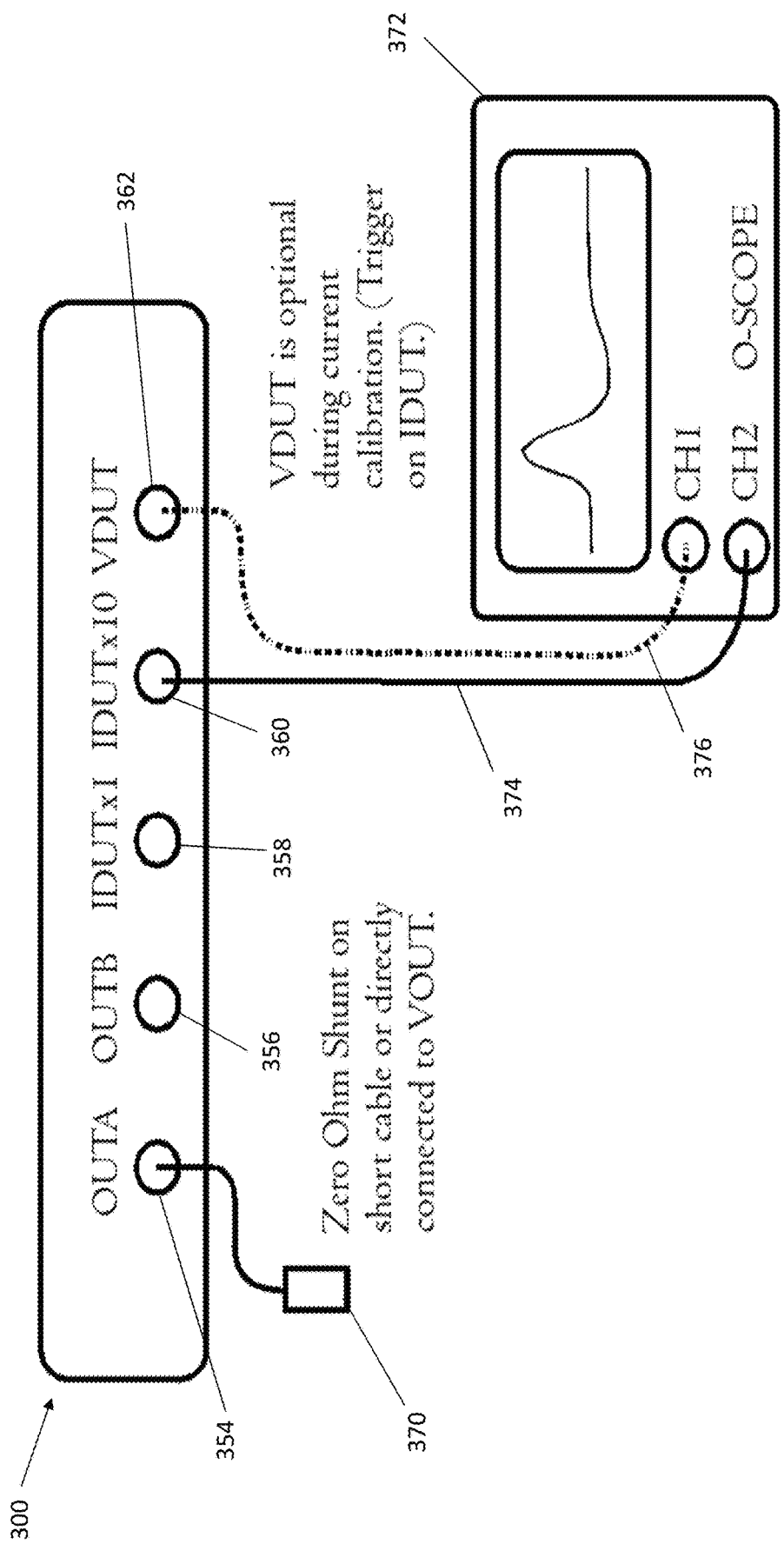

FIG. 12 illustrates current calibration test connections for the field collapse pulser shown in FIG. 6.

Figure 13:
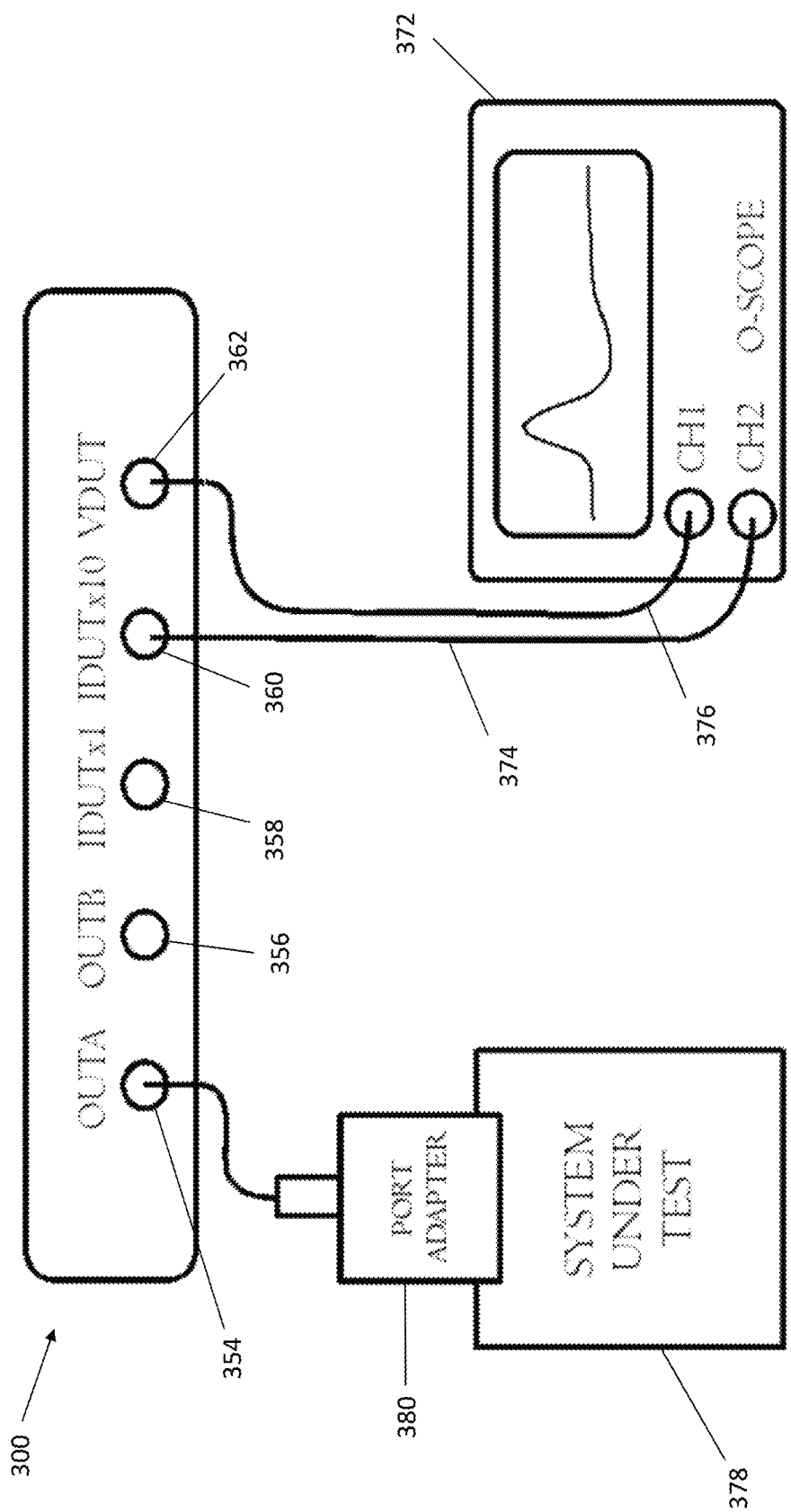

FIG. 13 illustrates test connections for the field collapse pulser shown in FIG. 6.

Figure 14:
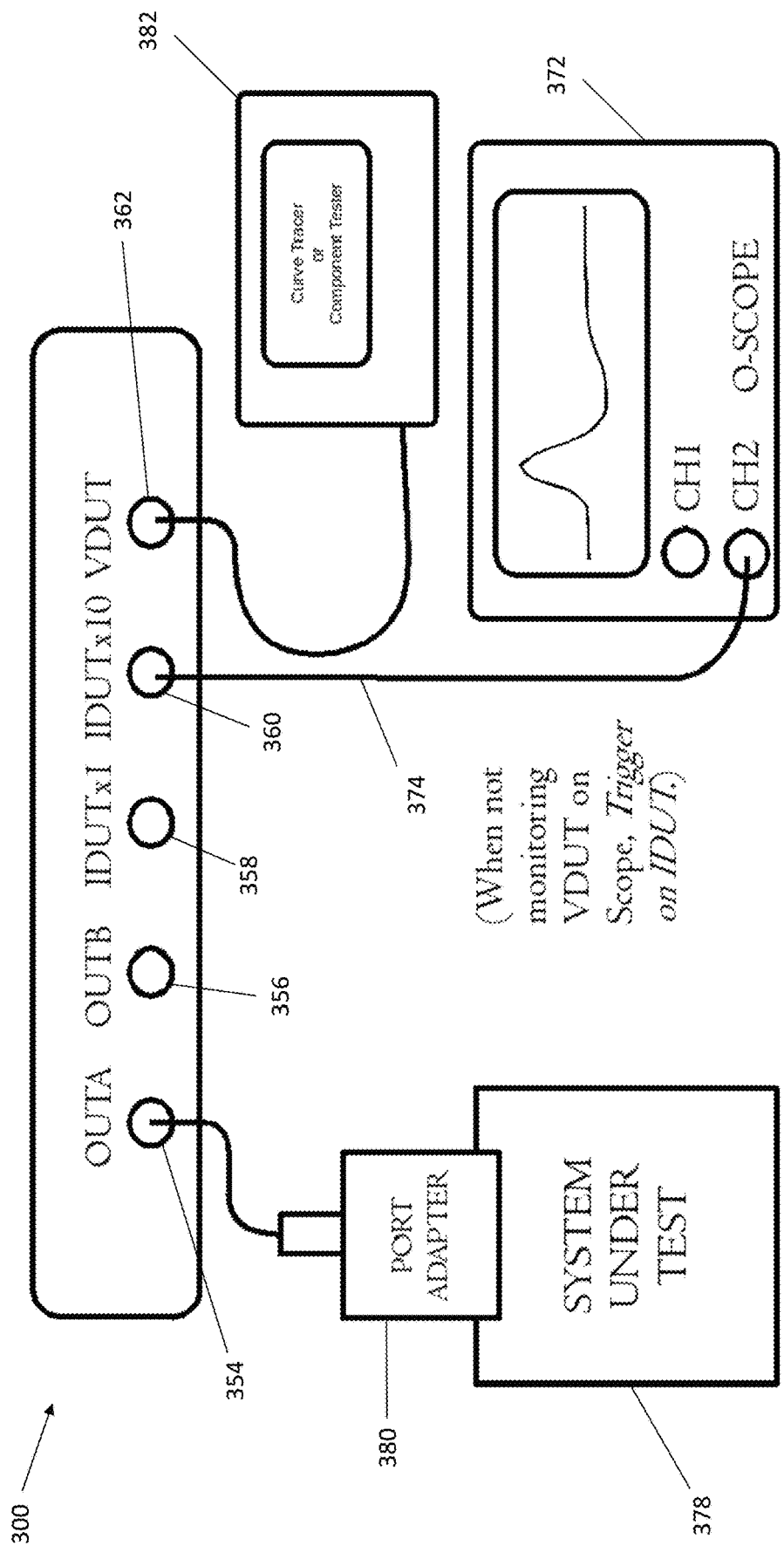

FIG. 14 illustrates leakage and curve tracer (I/V) test connections for the field collapse pulser shown in FIG. 6.

Corresponding reference numerals may indicate corresponding (though not necessarily identical) features throughout the several views of the drawings.

DETAILED DESCRIPTION

The present invention now will be described more fully hereinafter with reference to the accompanying drawings, which are intended to be read in conjunction with both this summary, the detailed description and any preferred and/or particular embodiments specifically discussed or otherwise disclosed. This invention may, however, be embodied in many different forms and should not be construed as limited to the embodiments set forth herein; rather, these embodiments are provided by way of illustration only and so that this disclosure will be thorough, complete and will fully convey the full scope of the invention to those skilled in the art.

As noted above, IEC 61000-4-2 (and variants such as ISO 10605) are the primary system level electrostatic discharge (ESD) qualification emulation tool, sine qua non. Industry and regulatory requirements the world over dictate product robustness and acceptance standards based on this Human Metal Model (HMM) "gun" testing.

The inventor hereof has recognized the following. As a characterization tool, gun testing is unsatisfactory due to lack of repeatability with size and condition of operators, lab environment, gun manufacturer variability, and unspecified electromagnetic compatibility (EMC) radiation effects causing soft failures. Therefore, while "gun" testing can help identify possible system robustness problems in qualification, it is of little help in going further to characterize the entry/exit vectors, levels and localized susceptibilities within the system that need to be optimized and improved.

While Transmission Line Pulse (TLP) testing is an excellent and mature characterization technology, TLP testing is primarily the province of semiconductor manufacturers due to both cost and expertise requirements. System level engineers and designers may not have the resources required or exigent need to do such rigorous testing. Accordingly, the inventor hereof has recognized that a reliable, less expensive alternative for debugging ESD and transient soft-failures would be of great value.

Chip level electronic devices must meet industry standard transient susceptibility standards in order to be reliably integrated into systems in controlled Electrostatic Protected Area (EPA) manufacturing environments. These standards include Human Body Model (HBM) and Charged Device Model (CDM) for chips, and basic manufacturing facility controls, such as Electrostatic Discharge Association (ESDA) S20.20.

System Level electronics likewise must incorporate sufficiently robust transient protection mechanisms and schemes for them to survive in the much harsher, less controlled or uncontrolled end-user environment.

System designers must take care to design their systems so that they redirect and repel ESD strikes (such as IEC61000-4-2 "gun" testing) away from delicate advanced semiconductors and/or ASIC interface ports. These ASIC ports are protected internally by basic chip-level ESD structures which protect the device during manufacturing and shipping against ESD strikes in controlled environments.

In order to competently evaluate these interoperating and sometimes conflicting ESD protection systems, and to optimize the effective implementation of both chip and system protection, the system designer can adopt industry standard "System ESD Efficient Design" (https://www.wiley.com/en-us/System+Level+ESD+Co+Design-p-9781118861844) strategies, including nodal circuit simulations to predict and select the best protection devices and designs.

To create these simulations, the designer requires detailed and reliable models made from repeatable tests, such as Transmission Line Pulsers. Simple current-voltage (I/V) curve tracers cannot measure the responses to high currents and pulses inherent to ESD and other transient aggressors. Additionally, IEC "gun" testing is not sufficiently repeatable to extract meaningful characterization data from, as "gun" testing was intended for meeting a qualification level. IEC61000-4-2 is not a useful characterization tool for this reason.

While TLP is routinely used for characterization on devices, the inventor hereof has recognized that TLP is not suitable in most cases for system level testing for the following reasons. TLP is very expensive due to precision impedance matched pulse generators and sensors. TLP pulsers can be damaged when connected to powered devices. TLP pulsers must be tuned to a characteristic impedance (e.g., 50 Ohms or 330 Ohms). Due to the high impedance, TLP pulsers require very high voltages (many kV) to create very high current pulses (>30 A).

Where IEC61000-4-2, or "Human Metal Model" and also Human Body Model emulate a charged human discharging into a system/device via skin or metal tool, Charged Board Events may occur in every condition, with discharges through skin, hand tools, or even machinery or cables. In the former type, a human (with approximated capacitance of 100-150 picofarads (pF)) is assumed to have been tribocharged to an expected environmental level and then discharged into the port, giving a known typical reference discharge pulse characteristic that is independent of the system, and dependent primarily on the Human and/or ambient characteristics. In the latter case, a Charged Board Event discharge, like CDM, depends largely on the size and configuration of the system device itself, and is often independent of human characteristics at all.

In both types of systems, there is a charge accumulated which is discharged into or out of the system through a usually lossy interface impedance (e.g., port, spark, etc.). The variability of the human element makes IEC61000-4-2 difficult to repeat as mentioned, but it also ignores a real ESD threat to devices from charged systems.

As recognized by the inventor hereof, the Field Collapse Event provides a novel and repeatable representation of actual field ("field" as in end-user) stressors and threats. The inventor hereof developed and/or discloses herein exemplary embodiments of field collapse pulsers that may address one or more (but not necessarily any or all) of the aforementioned shortcomings, limitations, and/or deficiencies. In exemplary embodiments, the field collapse pulser may be configured to provide the designer an inexpensive, high-current pulse with energy levels correlated and/or comparable to ESD without dangerous high voltages and with the Device or System Under Test unpowered or powered and functional. In exemplary embodiments, the field collapse pulser may provide the advantages of lower cost and simplicity, and therefore wider characterization availability in the industry.

In an exemplary embodiment, a field collapse pulser device may be configured to follow a basic form of a Field Collapse Event qualification method but with a fixed capacitor stack instead of a CDUT (the capacitance between the DUT and the Field Plate) component of the physical system under test in a Charged Board Event, for example.

Instead of relying on the inherent coupling capacitance of the system (between system and ground plane), the field collapse pulser fixes the charge plate stack into a single (or selectable/adjustable) and reusable plate stack in this exemplary embodiment. The elements GND1, Charge Plate, and GND2 may be generally analogous to a DUT, an induction plate, and ground plate, respectively.

The Charge Plate is charged from a high voltage supply with respect to GND2 and discharged (shorted) by a relay between same.

Instead of a grounded wire contact for discharging DUT ports (between GND1 and GND2), GND1 is routed through a tester port (such as the center conductor of a coaxial chassis connector) and GND2 is connected to the (isolated) shield of same. This then provides two isolated contact points, which can be applied to a powered or unpowered DUT port (e.g., connect GND1 to USB D+, and GND2 to USB_GND or USB_Shield).

Since GND1 is essentially electrically floating, GND1 will obtain the potential of the DUT signal bias (e.g., 0V for off, 5V if pull-up resistors exist in the DUT, etc.). Also, since the tester can be isolated, the connections to the DUT can be reversed (GND2↔GND1) to change the polarity of the initial peak output pulse.

The advantage here is that the probe leads can be safely connected to any device configuration with powered or unpowered modes, and any normal peripheral cabling as in IEC61000-4-2, unlike TLP testing which can damage the pulse generator if used on powered systems. In addition, the output pulse can be connected to a loop H-field or E-field near-field probe to generate ESD-like EMI interference, which can help isolate and characterize soft-failures as well.

Beyond the basic three-plate fixed Field Collapse capacitor stack, it is also possible to implement various optional features which expand the characterization and qualification functionality.

For example, the capacitor stack could be implemented as a low-cost PCB integrated into the tester board, or it could be extended for user replacement of multiple capacitance values as a card-edge connected module. Altering the area and dielectric thickness of the plates as simple areas on layers of a printed circuit board would give the user complete control over pulse shape and energy for a given charge voltage.

Additionally, with a "pluggable" module implementation, the entire type of pulser could be interchanged for very low additional cost. For example, an IEC61000-4-5 Combination Wave Pulse module could be implemented with just a few additional passive RLC (resistor, inductor, capacitor) devices. The main FC-Pulser circuitry is, primarily, a high-voltage power supply and relay which is required uniformly in most transient pulse emulators. This brings overall per-lab costs down by not replicating the core functions in multiple tester units. In exemplary embodiments, a segmented PCB stack may be used to create a specially shaped pulse (such as an IEC), which would comprise a field collapse pulser (FCP) including multiple plates and segments.

For instrumentation, it is convenient to observe and record the pulse current and voltage on the DUT. Current can be monitored unobtrusively with a loop/inductive probe around the pulser output line to the DUT. Since the pulse is inherently capacitively coupled, there is no net DC offset, and a less expensive narrow bandwidth probe can be utilized with excellent calibration accuracy. However, the DUT current may also be measured with a low resistance shunt to GND2. 1.00 Ohm provides a convenient 1V=1 A measurement calibration, as well as a fortuitous damping factor that attenuates the sinusoidal ringing subsequent to the initial pulse peak. Smaller values can be used to reduce the effect of the tester on effective voltages seen at the DUT.

For voltage probing, any normal oscilloscope probing techniques may be used, including probes on various and multiple simultaneous points WITHIN the DUT, but also utilizing a fixed "PICK-OFF TEE" circuit within the Tester at the PULSE OUT port.

One advantage of TLP testing, and the primary goal of its creation was to provide a flat, stable sampling window for device testing at high pulse currents, without applying extremely large energies to the DUT. For example, a 1 mA curve trace may use a sinusoidal or triangular wave to stress the part and read the I/V response. However, applying a continuous waveform at tens of amps would often destroy the device.

The charge line from the TLP provides a finite Q to be delivered to the device at each pulse level (analogous to ESD) instead of a continuous current that can cause EOS.

One important challenge of measuring current and voltage on a TLP system is alignment and delay of windows for the current and voltage probes, which may necessarily be spaced with some electrical distance from each other. This gives important information about timing and phase reactions of the DUT.

In the case of ESD protection in a regime (such as HBM) where the effective failure mode may not be dependent on the initial voltage peak (such as with Gox breakdown), the user may be interested in the initial peak voltage and initial peak current of the damped FCE pulse. For many circumstances including fast transient-voltage-suppression (TVS) devices and advanced node ASIC I/O cells, the peak I/V performance of the DUT is comparable to the windowed I/V measurement of a TLP test.

In the cases where initial peak current and voltage are sufficient to describe the I/V curve of the device (using successive steps of charge voltage to map out the I/V curve as with TLP), then an interesting cost savings can be leveraged. In all TLP testers, the data acquisition is usually implemented with a high performance dedicated oscilloscope. This oscilloscope may represent a very large portion of the investment required for the test system. In the present invention, the peak voltage and current values can actually be recorded with relatively inexpensive and low-bandwidth sample-and-hold A/D converters. Since the damped sinusoid will only have a single initial peak value per pulse (due to losses in the DUT, and parasitic losses if a shunt current probe is used), then the sample and hold does not even have to include hold off functionality within the pulse, and can simply be gated per each pulse. This feature alone, enabled by the nature of the Field Collapse pulse shape and being partitioned in a fortuitous configuration could completely eliminate the need for an additional oscilloscope, bringing the cost of the solution down dramatically. At the same time, this reduces test equipment damage risk as high-bandwidth scopes are usually fairly susceptible to ESD and other transients, and very expensive to repair or replace.

Additionally, since the FCP plate stack configuration is independent from DUT shape and orientation (as in the CBE or FCE apparatus) it is possible to connect directly to a system-level port pin, or even a "dead bug" or flying probe unitary device. For example, one pulser output port may be exposed from the tester as an SMA or BNC coaxial connector, and an 0402 or SOD882 surface mount TVS device to be tested could be soldered to an SMA or BNC jack and connected directly to the tester. Alternately, the PULSE OUT port could natively support industry standard I/O ports like USB, HDMI, DisplayPort, Ethernet, etc.

During such testing, as is often done with step testing-until-failure with IEC610000-4-5 or with TLP, it may be desirable to test the DUT for functionality or specification compliance (such as DC leakage). The electrically floating nature of the pulser GND1 plate allows the possibility of measuring some "signs of life" without adding a switch in line as is required in other testers. In fact, this switch implementation is often not trivial in a TLP system as it must be critically impedance matched as well as high voltage tolerant. In the present invention, this functionality probing could consist of a high impedance DC leakage test through a solid state resistor.

If a switch or isolation element is included for functional testing (in lieu of manually disconnecting the DUT port from the PULSE OUT port to perform functional or eye diagram or BERT or leakage testing, to name a few), then the tester could provide the functional testing circuitry as well.

For automation and convenience, all of the testing above could be done manually at the levels desired, or it could all be automated by computer controlled high voltage supply setting, relay triggering and functional or electrical failure criteria testing at each step level.

The ability to test powered and unpowered systems with cabling and power sources identical to IEC61000-4-2 test configurations, and even side-by-side with gun testing on the IEC test table, is a unique expansion of evaluation and characterization, especially at the system level, but also at the component level.

Additionally, considering the configuration of a typical IEC61000-4-2 or ISO10605 testing lab, the present invention fits without additional requirements of expensive and delicate oscilloscopes or dangerously exposed high voltage supplies or charged systems.

Charged Board Events can be implemented quite simply with a discharge wire and a high voltage power supply (or ESD gun used to charge the board.) The resultant damped sinusoidal pulse is a real-world, non-HMM ESD.

As a simple and repeatable conducted low-impedance ESD Pulse generator alone, the present invention provides an excellent debug and analysis tool, especially for difficult to isolate soft-failures. It is also an excellent relative merit analyzer for comparing, contrasting and optimizing multiple system configurations, TVS protection or shielding options. Due to the nature of the damped sinusoid, it is also possible to sample-and-hold peaks on successive pulses to fully characterize I/V curves without expensive oscilloscopes.

For component analysis, such a system could measure, analyze, and auto generate a functional quasi-static Spice model for SEED simulation in a very economical package, utilizing nothing more than a basic microcontroller and low-cost sample-and-hold A/D converters.

Among other things, exemplary embodiments of the present invention may provide a field collapse pulser that does not suffer from any of the problems or deficiencies associated with prior solutions. Exemplary embodiments of the present invention may reduce the cost of tester production. Exemplary embodiments of the present invention may expand the availability of reliable pulsed characterization data in the system level development community for optimization and analysis and even simulation.

In its most complete form, exemplary embodiments of the present invention would most outwardly appear indistinguishable from a typical TLP or IEC61000-4-5 pulser test system, and might be used in conjunction with, or in some applications instead of, such an established characterization system.

In exemplary embodiments, the field collapse pulser comprises a self-contained, automated test unit with an adjustable HV power supply, a fixed or adjustable charge plate stack, a trigger/pulse initiation controller, a PULSE OUTPUT port, optional voltage, current, leakage and functional failure criteria test models integrated into the unit including appropriate sample-and-hold data collection functionality.

Such a unit can provide a streamlined characterization and qualification test with repeatable and verifiable process, without requiring ESD or TLP calibration expertise. ASICs, Protection Devices and TVSs as well as systems combining these elements can all be tested with this invention, and the I/V data extracted can be used to directly simulate and optimize results using the Industry Council reference "System Efficient ESD Design" methodology among others.

Figure 1:
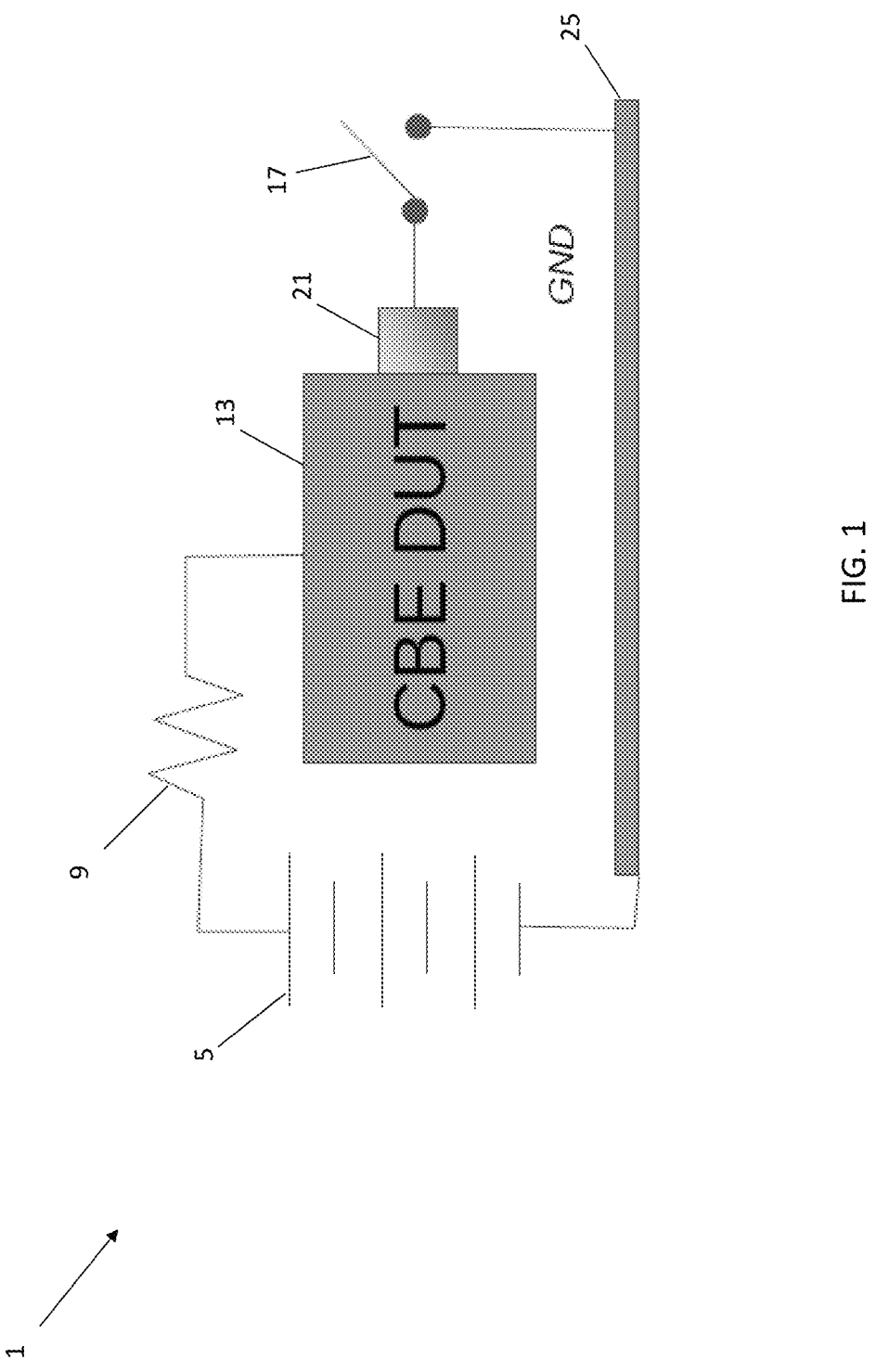
FIG. 1 illustrates a conventional Charged Board Event (CBE) Device Under Test (DUT) configuration.

Referring to the figures, FIG. 1 illustrates a conventional Charged Board Event (CBE) Device Under Test (DUT) configuration 1. In this basic Charged Board Event configuration 1, a High-Voltage Power supply 5 and current limiting resistor 9 (to prevent rapid charging rise time and potential secondary discharge) raise the CBE DUT 13 to the desired potential. Then, a switch 17 shorts the desired I/O pin 21 to the ground (GND) plate 25. This way the charge contained on the unit and in the effective capacitor "CDUT" between the CBE DUT and the Ground plate is discharged through that I/O pin or contact point.

Figure 2:
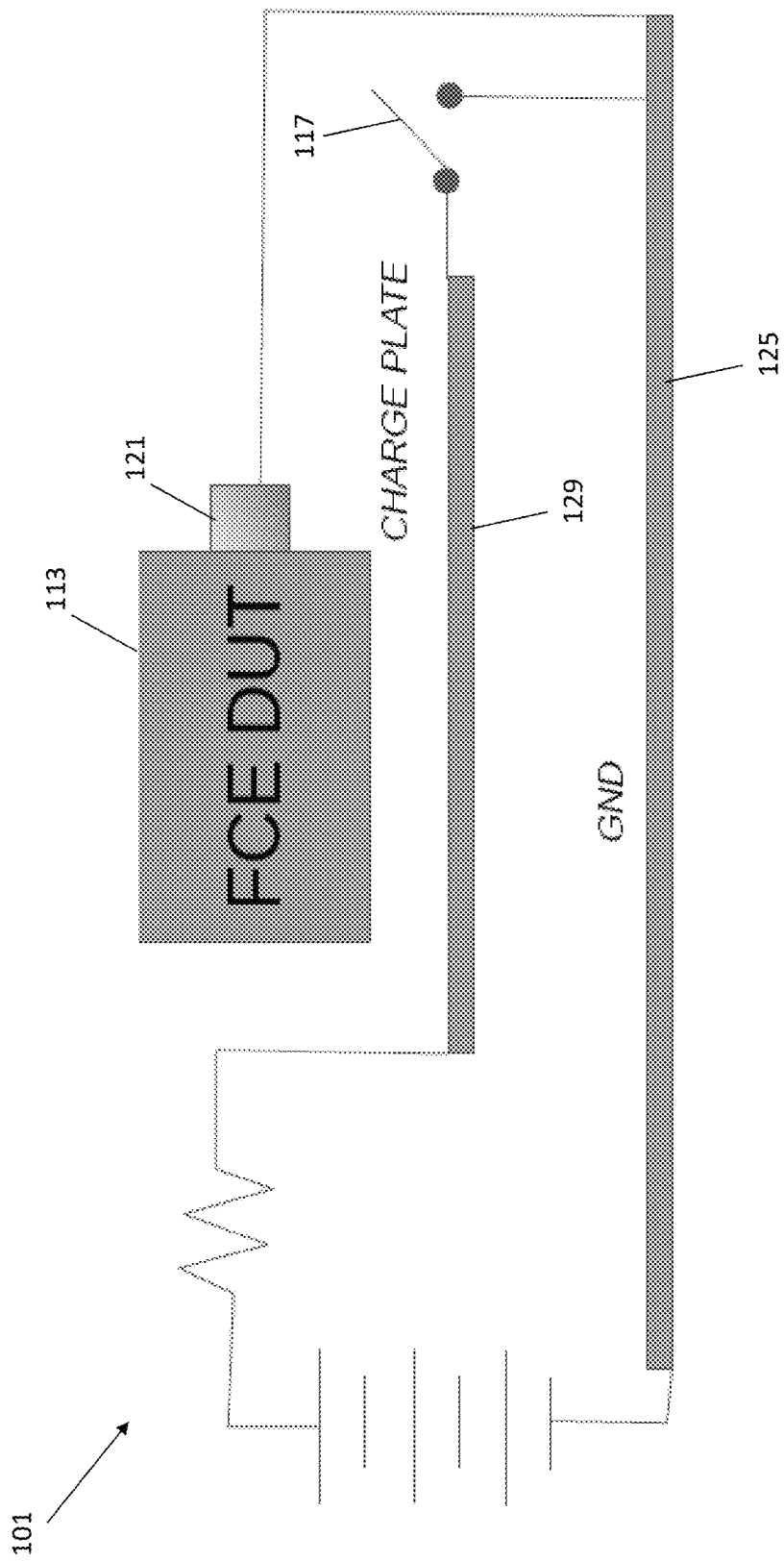
FIG. 2 illustrates a conventional Field Collapse Event (FCE) Device Under Test (DUT) configuration in which a separate charge plate has been added to the CBE DUT configuration shown in FIG. 1 to create the Field Collapse Event.

FIG. 2 illustrates a conventional Field Collapse Event (FCE) Device Under Test (DUT) configuration 101 in which a separate charge plate 129 has been added to the CBE DUT configuration 1 shown in FIG. 1 to create the Field Collapse Event. The DUT 113 is grounded directly (without a switch) to the ground (GND) plate 125 via the same desired I/O pin 121 as in the CBE setup 1 shown in FIG. 1. The switch 117 now discharges the Charge Plate 129 to ground plate 125. When this field collapses, the voltage between the Charge Plate 129 and the FCEDUT 113 also changes resulting in a dV/dt displacement current between the FCE DUT 113 and the Charge Plate 129 through the desired pin contact. In this case, the switch 117 (e.g., relay, etc.) is not directly in the discharge path.

Figure 3:
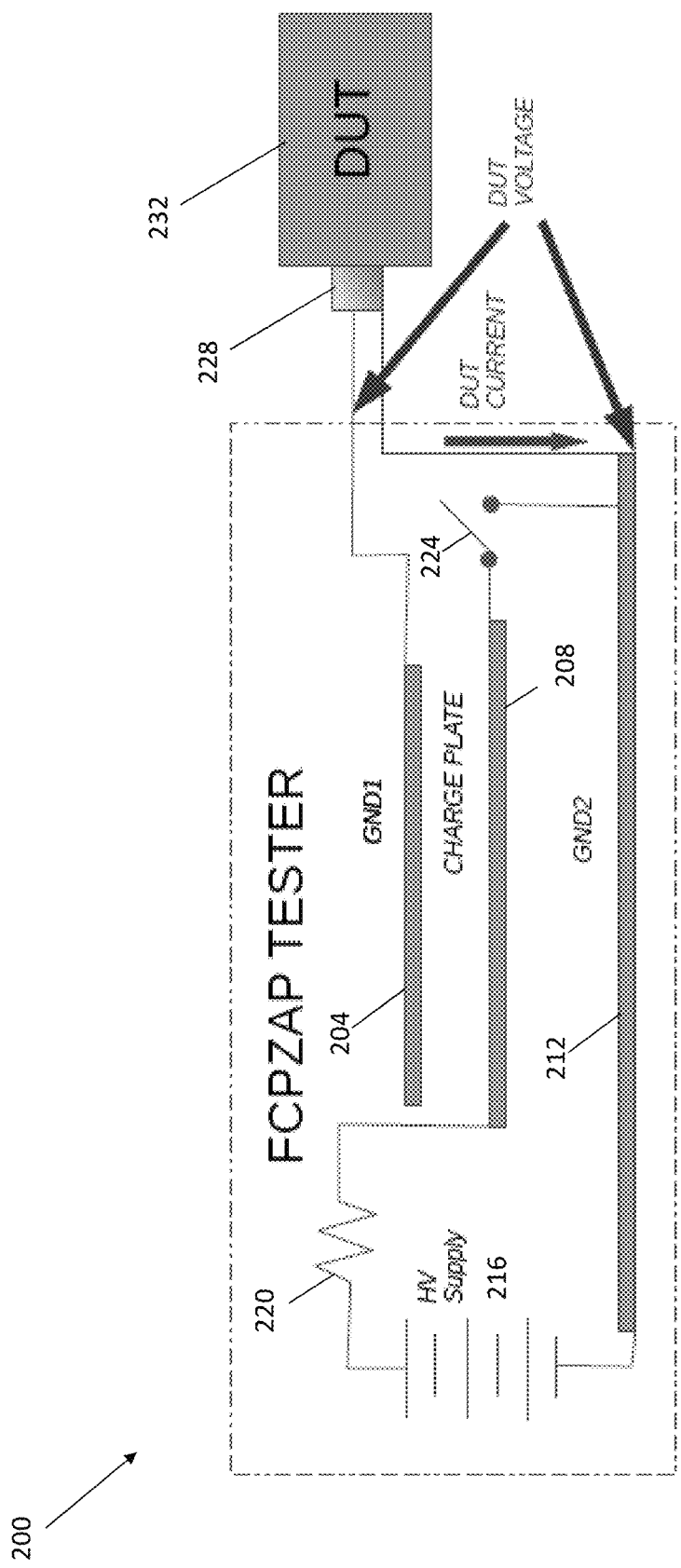
FIG. 3 illustrates a Field Collapse Pulser (FCP) zap tester according to an exemplary embodiment of the present disclosure, and generally shows the advantage of Field Collapse Pulser partitioning.

FIG. 3 illustrates a Field Collapse Pulser (FCP) zap tester 200 according to an exemplary embodiment of the present disclosure, and generally shows the advantage of Field Collapse Pulser partitioning. FIG. 3 shows the consolidation of the Field Collapse stack into three fixed plates, specifically, a first ground plate 204 (GND1), a charge plate 208, and a second ground plate 212 (GND2). In this exemplary embodiment, the GND1-GND2 discharge path is routed external to the tester 200 to allow generic devices to be connected. Also shown in FIG. 3 are a High-Voltage (HV) Power supply 216 and current limiting resistor 220 that raise the DUT 220 to the desired potential. A switch 224 shorts the charge plate 208 to the second ground plate 212.

The charge plate 208 is charged from the high voltage supply 216 with respect to the second ground plate 212 and discharged (shorted) by the switch 224 (e.g., relay, etc.) between the charge plate 208 and the second ground plate 212.

Instead of a grounded wire contact for discharging DUT ports (between GND1 and GND2), the first ground plate 204 (GND1) is routed through a tester port and the second ground plate 212 (GND2) is connected to the (isolated) shield of the same tester port. For example, the first ground plate 204 (GND1) may be routed through a center conductor of a coaxial chassis connector, and the second ground plate 212 (GND2) may be connected to the (isolated) shield of the same coaxial chassis connector. This exemplary embodiment thus provides two isolated contact points, which can be applied to a powered or unpowered port 228 of a DUT 232 (e.g., connect GND1 to USB D+, and GND2 to USB_GND or USB_Shield).

Because the first ground plate 204 (GND1) is essentially electrically floating in this exemplary embodiment, the first ground plate 204 will obtain the potential of the DUT signal bias (e.g., 0V for off, 5V if pull-up resistors exist in the DUT, etc.). Also, because the tester 200 can be isolated, the connections to the DUT 232 can be reversed (GND2↔GND1) to change the polarity of the initial peak output pulse.

Modern SEED (System Efficient ESD Simulation) characterization and analysis techniques have advanced to the point that "virtual" TVS protection devices can be evaluated for each input/output (I/O) type, and TVS vendor parametric selection software can automatically analyze and recommend the best protection device for each particular ASIC I/O. A significant limitation of SEED characterization and analysis techniques is the necessity for high-current relevant ESD device models for both the protection (TVS) device and the protected (ASIC) device. In most cases, modern TVS manufacturers are forthcoming with TLP characterization data for their devices. But ASIC manufacturers (core logic, system on a chip (SoC), PHY layer chip) are restricted or held under Non-Disclosure Agreements (NDAs) if they are distributed to customers at all because there is a fair amount of Intellectual Property exposed in the I/V curve of advanced node I/O cell protection schemes. The extremely thin profit margins of system manufacturing often make large capital investments in test equipment like TLP cost prohibitive. On the other hand, effective protection optimization with the SEED methodology is endorsed by dozens of leading semiconductor companies, and providing a limited way their customers could extract the needed I/V data for themselves by using an exemplary embodiment of a field collapse pulser disclosed herein would advantageously alleviate the support and distribution of data required for customers.

Figure 4:
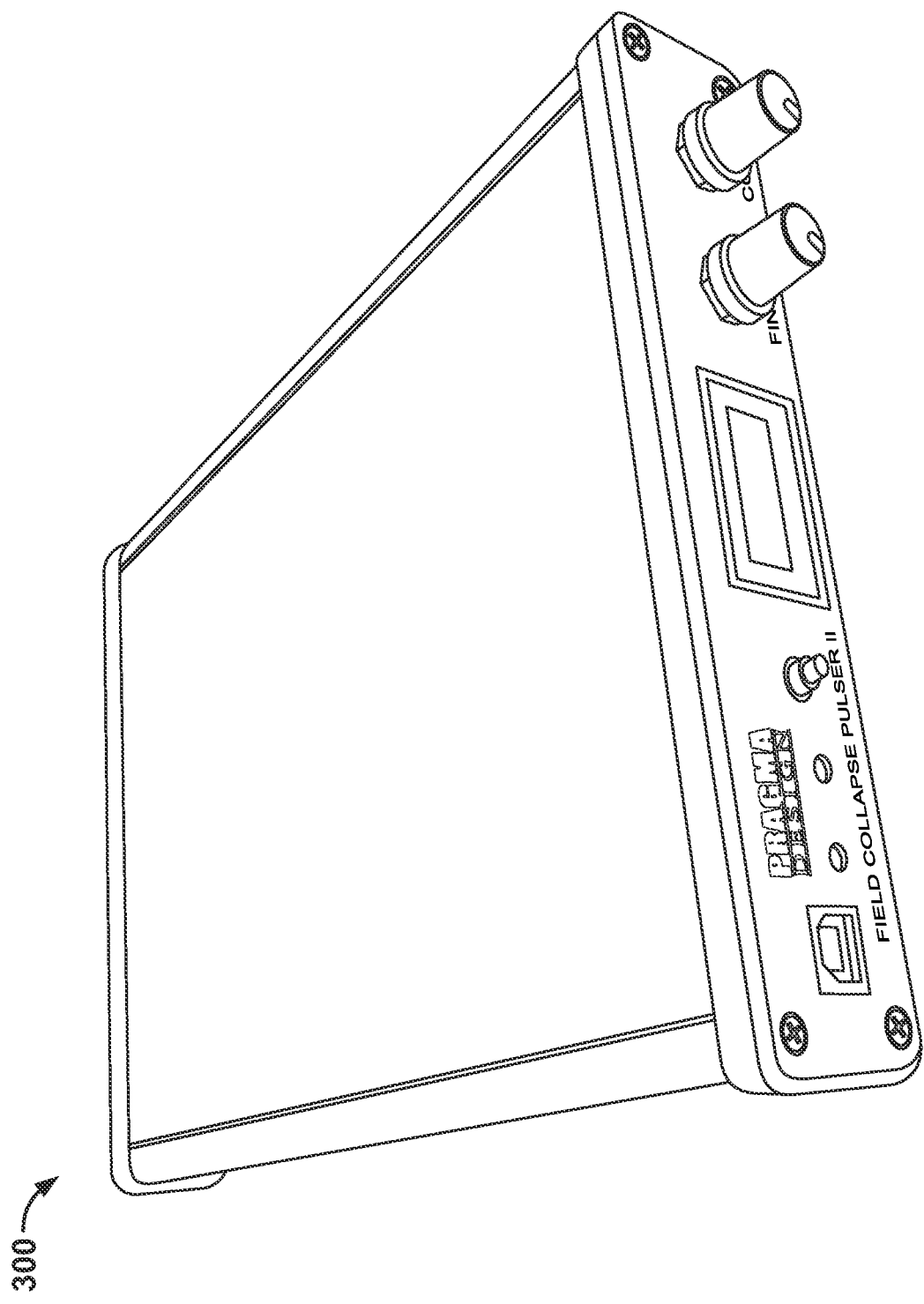
FIG. 4 illustrates a field collapse pulser according to an exemplary embodiment of the present disclosure.
Figure 5:
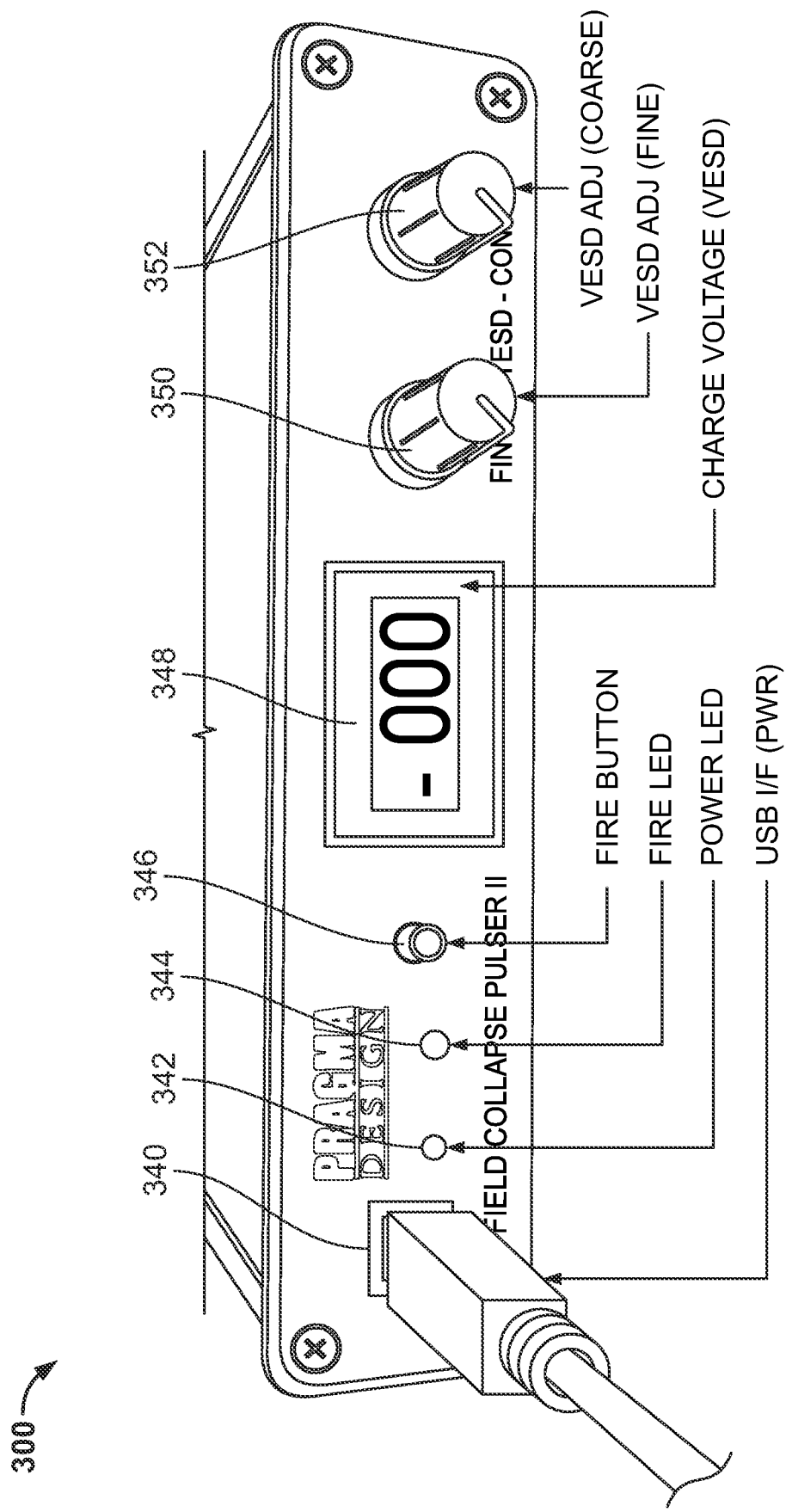
FIG. 5 illustrates the front panel controls of the field collapse pulser shown in FIG. 4.

FIGS. 4 through 6 illustrate an exemplary embodiment of a field collapse pulser 300 including a plurality of front panel controls (FIG. 5) (broadly, a user interface) and a plurality of back panel connections or ports (FIG. 6). As shown in FIG. 5, the field collapse pulser 300 includes a USB I/F power port 340, power indicator LED 342, fire indicator LED 344, a fire button 346, a charge voltage display (VESD) 348, a VESD fine adjustment knob 350, and a VESD coarse adjustment knob 352. Alternatively, a field collapse pulser may be configured with a different user interface, such as one or more other indicators, buttons, displays, and/or knobs in other exemplary embodiments.

As shown in FIG. 6, the field collapse pulser 300 includes a first connection (OUTA) 354, a second connection (OUTB) 356, a third connection (1DUT×1) 358, a fourth connection (1DUT×10) 360, and a fifth connection (VDUT) 362. The first connection 354 is configured for pulser output to DUT (positive polarity). The second connection 356 is configured for pulser output to DUT (negative polarity). The third connection 358 is configured for connection with a 1 Ohm shunt current probe (1V into 50 Ohms=1 Amp). The fourth connection 360 is configured for connection with a 0.1 Ohm shunt current probe (1V into 50 Ohms=10 Amps). The fifth connection 362 is configured for connection with a 10× voltage attenuator (into 50 Ohms) monitoring DUT, and a 450 Ohm resistor may be usable to monitor leakage on the DUT. The fifth connection 362 may be protected by +/−15V TVS. Although FIG. 6 shows the back panel connections or ports as coaxial cable connections, a field collapse pulser may be configured differently with one or more other connection types in other exemplary embodiments.

In an exemplary embodiment, the field collapse pulser 300 may be configured to have the following features: 800V charge plate capable of 175 A peak field, collapse pulse via SMA and zap adapter, powered/unpowered testing, integrated curve tracer and leakage measurement, and manual operation or USB/PC control interface. The field collapse pulser may also be configured with an IEC61000-4-5 pulser module and/or an I/V extraction firmware.

The field collapse pulser 300 enables a repeatable and reliable low-impedance, high-current Charged Board Event (CBE) type damped sinusoidal pulse. With energies comparable to IEC61000-4-2 gun testing, the field collapse pulser 300 is ideal for detailed system level failure analysis. Utilizing the field collapse pulser 300 in a method as disclosed herein provides a realistic and repeatable energy level along with very high peak currents for characterizing transient susceptibilities, including while the device under test or system under test is powered or unpowered.

In an exemplary embodiment, the field collapse pulser 300 may be configured to have the following specifications: an adjustable/programmable charge voltage from 0V to +/−800V, a peak current of +/−175 A (into short), Usb3/HDM/DP port adapters, and probe outputs of VDUT (w/ 10× attenuator), IDUT (direct 1A=1V) and IDUT (w/ 10× attenuator) SMA connections. The field collapse pulser 300 may also be configured to have an operating temperature range from −5° C. to +50° C., an operating humidity range from 8% to 95% (non-condensing), and a storage temperature range from −20° C. to +85° C.

In an exemplary embodiment, the field collapse pulser 300 may be configured for manual control with integrated leakage test. In another exemplary embodiment, the field collapse pulser 300 may be configured for USB serial monitor and integrated data acquisition (DAQ) and without requiring an external scope. In a further exemplary embodiment, the field collapse pulser 300 may be configured to include SMA-USB adapters as disclosed herein. In an additional exemplary embodiment, the field collapse pulser 300 may be configured with SMA-USB functional check passthru.

Figure 7:
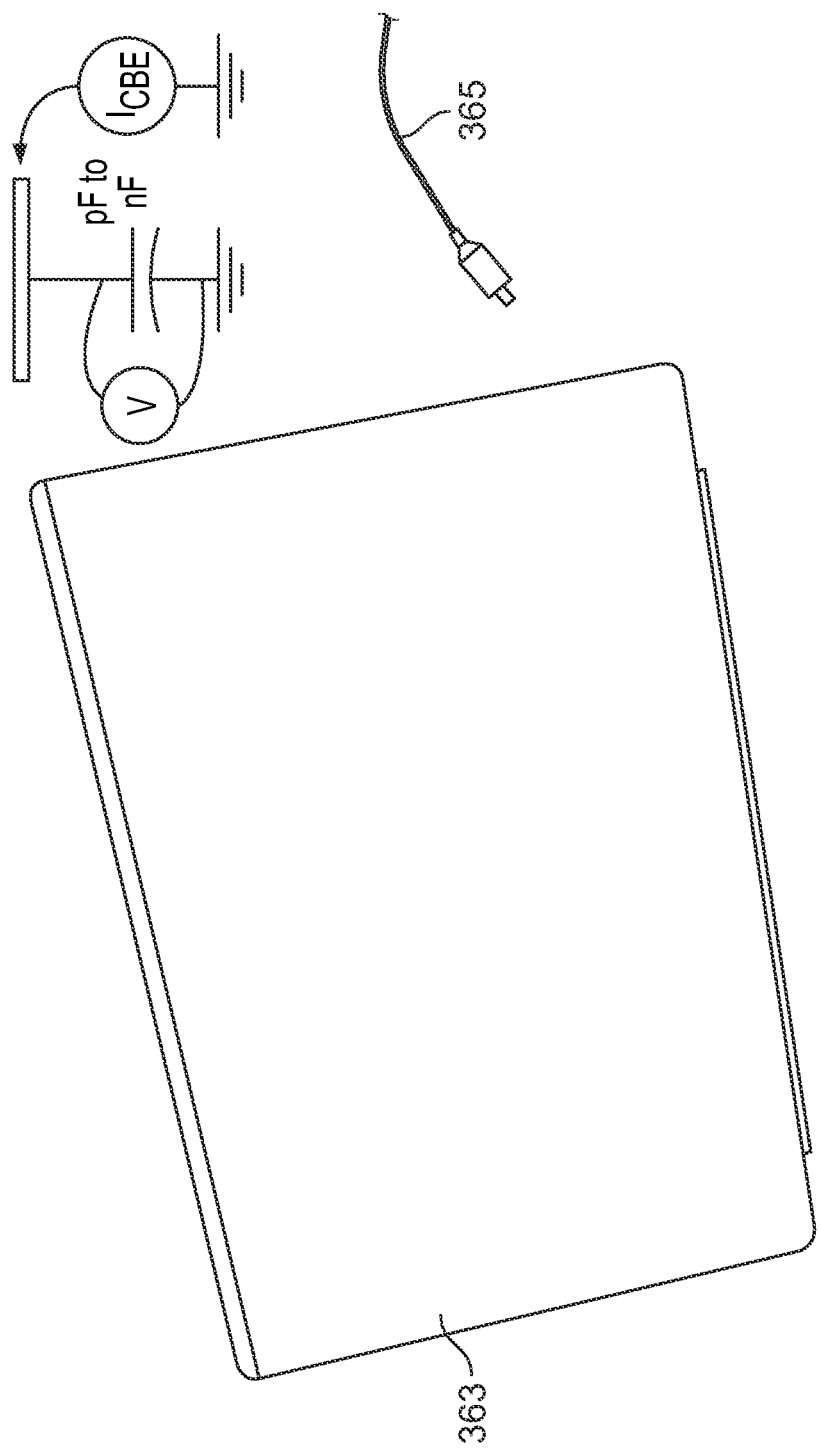
FIG. 7 represents a charged board event (CBD) for a laptop.

An introductory theory of operation will be provided for Field Collapse Pulse. The Field Collapse Pulse is an extension of the Charged Board Event, which like the Charged Device Model (CDM), is primarily related to the real world capacitance of the System Under Test and its potential charge level. For example, consider the laptop 363 shown in FIG. 7 that may have been charged by a user walking down a carpeted hall, placing the laptop 363 on a conference table, and then discharging it by connecting a device cable 365.

Figure 8:
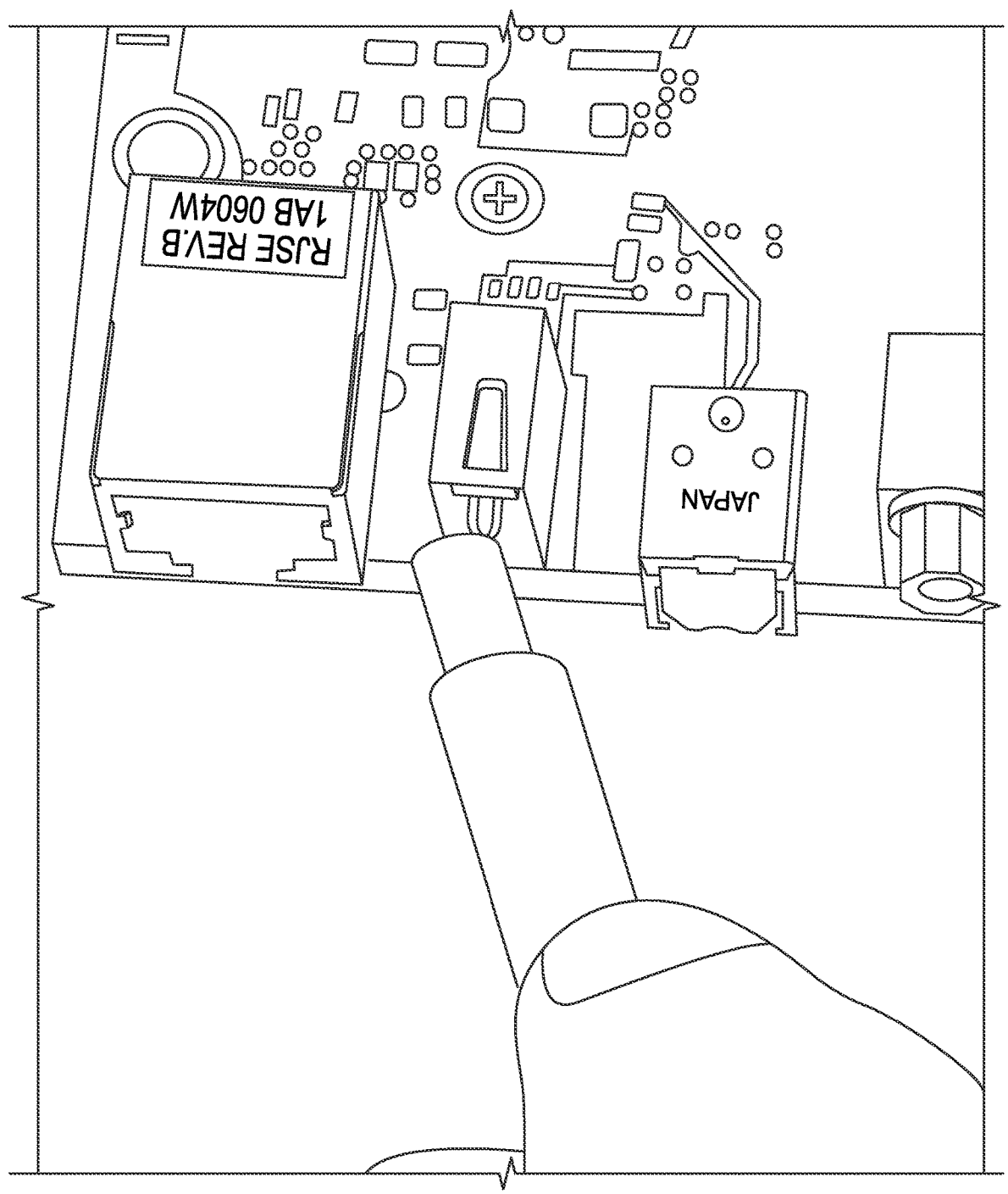
FIG. 8 illustrates how a charged board event discharge may occur, e.g., via ground shields or through misaligned cabling.

With reference to FIG. 8, a Charged Board Event discharge may occur via ground shields or through misaligned cabling, e.g., USB Type-C misalignment, etc. Removal of the USB plug at an angle may cause the $V_{BUS}$ pin to short with SBU or $CC/V_{conn}$ pins.

Charged Board Events are comparable to Field Collapse Pulses except that FCP allows the System Under Test (e.g., laptop, etc.) and ground plane to remain at the same potential, which provides an improved safety factor on the test bench. The CBE/FCP pulse type is a real-world event that is related to the inherent capacitance of the System Under Test for situations like connecting a grounded USB device to a charged laptop, for example. These events are similar but different from those emulated by IEC61000-4-2 ESD guns as shown in FIGS. 9 and 10.

Figure 9:
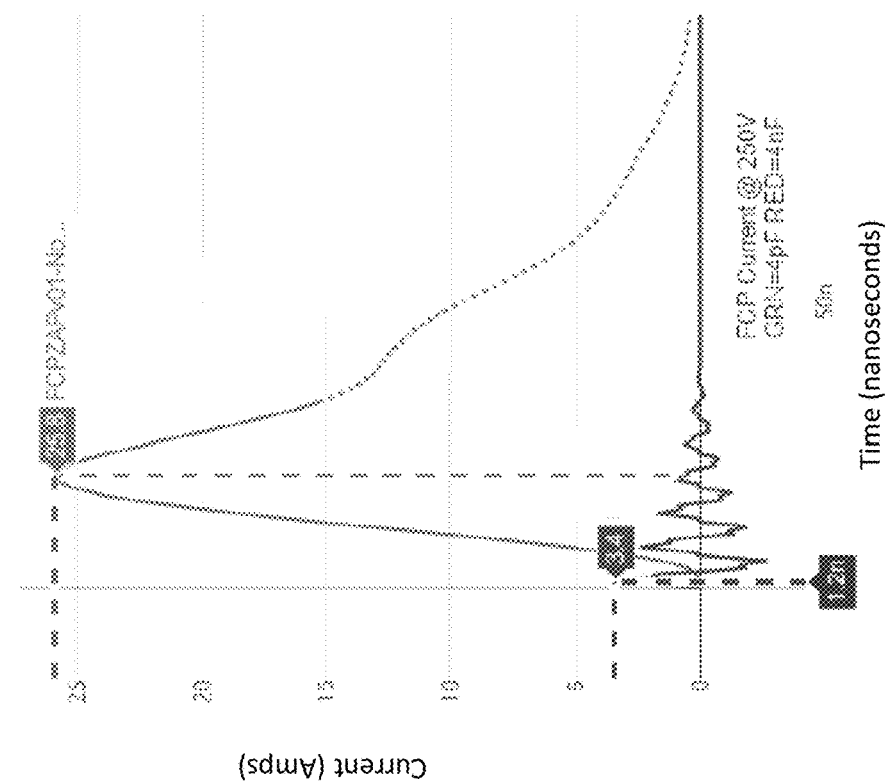
FIG. 9 is a line graph showing FCP current in Amps (A) versus time in nanoseconds (ns) at 250V with a capacitance at 4 nanofarads (nF) and a peak current of 25.8 A and at 250V with a capacitance at 2 picofarads (pF) and a peak current of 3.4 A.

FIG. 9 is a line graph showing FCP current in Amps (A) versus time in nanoseconds (ns) at 250V with a capacitance at 4 nanofarads (nF) and a peak current of 25.8 A and at 250V with a capacitance at 2 picofarads (pF) and a peak current of 3.4 A. FIG. 10 is a line graph of IEC61000-4-2 Current in Amps (A) at 12 kV and 8 kV versus time in nanoseconds (ns), and showing 22.6 A for 12 kV IEC into a typical 7V TVS.

Comparing total energy delivered, the low-impedance FCP output efficiently transfers into the TVS load at much lower charge voltages. See, for example, FIG. 11, which is a line graph of total energy transferred in microjoules versus time in nanoseconds (ns), and showing total energy into TVS 250V FCP at 4 nF capacitance.

FIG. 12 illustrates example electrical current calibration test connections for the field collapse pulser 300 shown in FIG. 6. As shown in FIG. 12, a zero ohm shunt 370 is on a short cable or directly connected to the first connection (OUTA) 354 of the field collapse pulser 300. Channels 1 and 2 of an oscilloscope 372 are respectively connected to the fifth connection (VDUT) 362 and fourth connection (IDUT× 10) 360 of the field collapse pulser 300. The connection of channel 1 of the oscilloscope 372 to the fifth connection (VDUT) 362 is not necessarily required during the electrical current calibration, as the trigger is on the IDUT.

With reference to FIGS. 4-6 and FIG. 12, an exemplary procedure or method to verify high-current operation or to set the unit to a charge voltage that will generate a desired target peak short-circuit current may include the following steps.

1. Connect at least the current oscilloscope cables 374, 376 (FIG. 12) to the IDUT monitor ports 360, 362, respectively (VDUT Optional).

2. Connect a shunt 370 (or an SMA cable with a short) to the desired positive pulse port 354 or negative pulse port 356.

3. Turn the voltage dial 352 (FIG. 5) all the way down (counter clockwise).

4. Attach USB power cord to the USB I/F power port 340.

5. Turn the voltage dial 350 up to a low voltage (10-15V) and press the fire button 346 to verify pulser operation on the oscilloscope scope 372 (FIG. 12). (Adjust the trigger source and level on NORMAL mode until the pulse is recorded.)

6. Read the peak current from the peak voltage observed. From the IDUT×1 port 358, the oscilloscope 372 will indicate 1V=1 A. From the IDUT×10 port 360, the oscilloscope 372 will indicate 1V=10 A.

7. A. Adjust the charge voltage to the highest level for use during the session and press the fire button 346 (FIG. 5) to verify the peak current meets the system specification (see your unit options for detail).

OR

B. Adjust the charge voltage and press the fire button 346 until the desired peak current is dialed in. Then, the user may connect the target DUT for testing. The user should keep in mind that the clamping impedance and breakdown voltage may be much higher than that of a shunt, and so the waveform may look somewhat different than calibration, and the peak current for a given voltage may be lower.

FIG. 13 illustrates test connections for the field collapse pulser 300 shown in FIG. 6. As shown in FIG. 13, a system under test 378 with a port adapter 380 is connected to the first connection (OUTA) 354 of the field collapse pulser 300. Channels 1 and 2 of an oscilloscope 372 are respectively connected to the fifth connection (VDUT) 362 and fourth connection (IDUT×10) 360 of the field collapse pulser 300.

With reference to FIGS. 4-6 and FIG. 13, an exemplary test procedure or method may include the following steps.
1. Connect the desired (if any) oscilloscope cables 374, 376 to the IDUT/VDUT monitor ports 360, 362.
2. Connect a shunt 370 (or an SMA cable with a short) to the desired positive pulse port 354 or negative pulse port 356 (as shown in FIG. 12).
3. Turn the voltage dial 352 (FIG. 5) all the way down (counter clockwise).
4. Attach USB power cord to the USB I/F power port 340.
5. Turn the voltage dial 350 up to a low voltage (10-15V) and verify pulser operation on the oscilloscope 372 (FIG. 13). If the load is open or high-resistance, the user will need to trigger off of the voltage port otherwise the user can trigger off of current.
6. Verify DUT operation/functionality. If powered, test port enumeration/function. If unpowered, test leakage, I/V, or other failure criteria.
7. Attach the system under test 378 with port adapter 380 (DUT/ZAP ADAPT) to the first connection (OUTA) 354 of the field collapse pulser 300.
8. At this point, the shield and the center conductor of the PULSE port are tied to either Pulser Ground (Bottom/GND2) or Plate Ground (Top/GND1), respectively. The first ground plate (GND1) (e.g., first ground plate 204 in FIG. 3, etc.) is natively electrically floating. But when the first ground plate (GND1) is connected through, for example, a USB data port, the first ground plate (GND1) will be within VUSB of the second ground plate (GND2) (e.g., second ground plate 208 in FIG. 3, etc.), thus can safely be handled and the DUT can always be powered and/or operate normal cabling at any time. For example, the DUT could be powered up and running failure criteria testing software continuously as the system is zapped.
9. Normal system or device level failure criteria (IEC61000-4-2) may be used in powered or unpowered modes.
10. Press and hold the fire button 346 (FIG. 5) until the fire LED 344 goes off and a pulse trigger is captured on the oscilloscope (optional).
11. Adjust charge voltage via voltage adjustment dials or knobs 350, 352 (FIG. 5) and repeat the procedure from step #6 as needed.

FIG. 14 illustrates leakage and curve tracer (I/V) test connections for the field collapse pulser 300 shown in FIG. 6. As shown in FIG. 14, a system under test 378 with a port adapter 380 is connected to the first connection (OUTA) 354 of the field collapse pulser 300. Channel 2 of an oscilloscope 372 is connected to the fourth connection (IDUT×10) 360 of the field collapse pulser 300. A curve tracer or component tester 382 is connected to the fifth connection (VDUT) 362 of the field collapse pulser.

With reference to FIGS. 4-6 and FIG. 14, an exemplary leakage and I/V test procedure or method may include the following steps.
1. Connect the desired (if any) oscilloscope cable 374 to the desired ×1 or ×10 IDUT monitor port 358 or 360.
2. Connect the desired (if any) I/V or curve tracer 382 to the VDUT port 362.
3. Turn the voltage dial 352 (FIG. 5) all the way down (counter clockwise).
4. Attach USB power cord to the USB I/F power port 340.
5. Turn the voltage dial 350 up to a low voltage (10-15V) and verify pulser operation on the oscilloscope 372 (FIG. 13). If the load is open or high-resistance, the user will need to trigger off of the voltage port otherwise the user can trigger off of current.
6. Verify DUT leakage or I/V curve. The VDUT port is isolated and protected by a 450 Ohm attenuation (10×) resistor and a +/−15V TVS clamp. Therefore, the leakage of the DUT will be included with the leakage of these protection/attenuator devices. But this provides the convenience with the FCP architecture that the I/V tester does not generally need to be switched out of the circuit. Warning: verify that tester 382 can tolerated the expected clamped output.
7. Attach the system under test 378 with port adapter 380 (DUT/ZAP ADAPT) to the first connection (OUTA) 354 of the field collapse pulser 300.
8. At this point, the shield and the center conductor of the PULSE port are tied to either Pulser Ground (Bottom/GND2) or Plate Ground (Top/GND1), respectively. The first ground plate (GND1) (e.g., first ground plate 204 in FIG. 3, etc.) is natively electrically floating. But when the first ground plate (GND1) is connected through, for example, a USB data port, the first ground plate (GND1) will be within VUSB of the second ground plate (GND2) (e.g., second ground plate 208 in FIG. 3, etc.), thus can safely be handled and the DUT can always be powered and/or operate normal cabling at any time. For example, the DUT could be powered up and running failure criteria testing software continuously as the system is zapped.
9. A fractional or maximum change or drift in the I/V values observed at the VDUT port can provide a "pre-functional" indication of DUT failure.
10. Press and hold the fire button 346 (FIG. 5) until the fire LED 344 pulses and a pulse trigger is captured on the oscilloscope (optional).
11. Adjust charge voltage via voltage adjustment dials or knobs 350, 352 (FIG. 5) and repeat the procedure from step #6 as needed.

Disclosed herein are exemplary embodiments of an electrostatic discharge (ESD) pulse generator (e.g., field collapse pulser) configured to be operable for generating energy and current pulses that are correlated to the stress levels common ESD and charged board events and/or that are comparable or similar to the stress levels common ESD and charged board events.

In exemplary embodiments, the ESD pulse generator is configured to be operable with powered circuits and with unpowered circuits, while avoiding the possibility of damage that may occur with transmission line pulse (TLP) testing.

In exemplary embodiments, the ESD pulse generator is configured to be operable for generating very repeatable current pulses unlike an IEC gun.

In exemplary embodiments, the ESD pulse generator is configured such that a shielded pulse runs through a coaxial cable and doesn't radiate unwanted electromagnetic interference (EMI).

In exemplary embodiments, the ESD pulse generator includes a fixed capacitor stack that replaces the effective stray capacitance with a known physical stack, which may be a single physical stack or a modular stack in which multiple different fixed stacks are plugged in.

In exemplary embodiments, the ESD pulse generator includes a printed circuit board (PCB) (e.g., FR4 PCB, etc.) that includes the capacitor stack.

In exemplary embodiments, the ESD pulse generator includes a capacitor stack that may be creatively segmented, tuned, and augmented with passive (RLC) elements to create specific pulse shapes.

In exemplary embodiments, the ESD pulse generator includes a capacitor stack that may be modularized and switched to provide different shaped pulses.

In exemplary embodiments, the ESD pulse generator includes output terminals that are referenced to ground so there is no high voltage danger during setup.

In exemplary embodiments, the ESD pulse generator is configured such that the output is isolated such that the ESD pulse generator is selectively operable for generating a positive pulse or a negative pulse simply by reversing connections.

In exemplary embodiments, the ESD pulse generator is configured such that the output can be switched with relays or solid state switching into individual USB, HDMI, and/or power pins safely without need for expensive high-voltage restricted mercury whetted relays.

While the present invention has been described above in terms of specific embodiments, it is to be understood that the invention is not limited to these disclosed embodiments. Upon reading the teachings of this disclosure many modifications and other embodiments of the invention will come to mind of those skilled in the art to which this invention pertains, and which are intended to be and are covered by both this disclosure and the appended claims. It is indeed intended that the scope of the invention should be determined by proper interpretation and construction of the appended claims and their legal equivalents, as understood by those of skill in the art relying upon the disclosure in this specification and the attached drawings.

What is claimed is:

1. An electrostatic discharge (ESD) pulse generator comprising:
a first ground plate, a charge plate, and a second ground plate;
a power supply electrically connected with the charge plate and the second ground plate;
a current limiting resistor or switch electrically connected in series with the power supply and the charge plate; and
a switch for electrically connecting the charge plate to the second ground plate;
whereby the charge plate is chargeable from the power supply and dischargeable via the switch between the charge plate and the second ground plate;
wherein:
the first ground plate is routed through a center conductor of a coaxial connector; and
the second ground plate is connected to a shield of the coaxial connector;
whereby the ESD pulse generator is configured to be operable for generating a transient current pulse that is routed through a coaxial cable when connected with the coaxial connector without radiating unwanted electromagnetic interference (EMI).

2. The ESD pulse generator of claim 1, wherein the ESD generator is configured such that a discharge path of the first ground plate and the second ground plate is routed external to the ESD pulse generator, thereby allowing for connection of a device under test (DUT) to the ESD pulse generator.

3. The ESD pulse generator of claim 1, wherein the current limiting resistor or switch is configured to be operable for raising a potential of a device under test (DUT) that is connected with the ESD pulse generator, whereby the first ground plate obtains a potential of a DUT signal bias.

4. The ESD pulse generator of claim 1, wherein the ESD pulse generator comprises a capacitor stack including the first ground plate, the charge plate, and the second ground plate, and wherein the capacitor stack comprises a single fixed capacitor stack or a modular capacitor stack including multiple different fixed stacks.

5. The ESD pulse generator of claim 1, wherein the ESD pulse generator comprises a printed circuit board including the first ground plate, the charge plate, and the second ground plate.

6. The ESD pulse generator of claim 5, wherein the ESD pulse generator is configured such that pulse shape and energy for a given voltage charge are determined by the printed circuit board's electrically-conductive portions and dielectric thicknesses at which the first ground plate, the charge plate, and the second ground plate are defined, whereby altering the printed circuit's board's electrically-conductive portions and dielectric thicknesses allows for controllably changing pulse shape and energy for a given charge voltage.

7. The ESD pulse generator of claim 1, wherein the ESD pulse generator comprises a capacitor stack including the first ground plate, the charge plate, and the second ground plate, and wherein the capacitor stack is segmented, tuned, and/or augmented with passive (RLC) elements to cause the ESD pulse generator to generate transient current pulses having specific pulse shapes.

8. The ESD pulse generator of claim 1, wherein the ESD pulse generator comprises output terminals that are referenced to ground thereby eliminating a possibility of high voltage danger during setup.

9. The ESD pulse generator of claim 1, wherein the ESD pulse generator is configured such that output is switchable with relays or solid state switching into individual USB, HDMI, and/or power pins.

10. The ESD pulse generator of claim 1, wherein the ESD generator is configured to be operable for generating energy and current pulses which have been correlated to the stress levels of common ESD and charged board events.

11. The ESD pulse generator of claim 1, wherein the ESD generator is configured to be operable for providing a high-current pulse with an energy level correlated to an electrostatic discharge without exposure to dangerous high voltage when testing a device under test (DUT) that is unpowered or that is powered and functional.

12. The ESD pulse generator of claim 1, wherein:
the ESD generator is configured to be operable with powered circuits and with unpowered circuits; and
the ESD pulse generator is configured to be operable for generating repeatable transient current pulses.

13. The ESD pulse generator of claim 1, wherein the ESD generator is configured to be operable for providing functionality probing of a device under test (DUT) including an impedance DC leakage test through a solid state resistor.

14. The ESD pulse generator of claim 1, wherein the ESD pulse generator is a field collapse pulser configured with field collapse partitioning.

15. The ESD pulse generator of claim 1, wherein the ESD pulse generator comprises a capacitor stack including the first ground plate, the charge plate, and the second ground plate, and wherein the ESD pulse generator comprises a self-contained, automated test unit including the power supply that is adjustable, the capacitor stack that is fixed or adjustable, a trigger/pulse initiation controller, and a pulse output port.

16. A system including the ESD pulse generator of claim 1 and an analog to digital (A/D) converter configured for data acquisition including recordation of peak voltage and current values generated by the ESD pulse generator.

17. An electrostatic discharge (ESD) pulse generator comprising:
- a first ground plate, a charge plate, and a second ground plate;
- a power supply electrically connected with the charge plate and the second ground plate;
- a current limiting resistor or switch electrically connected in series with the power supply and the charge plate; and
- a switch for electrically connecting the charge plate to the second ground plate;
- whereby the charge plate is chargeable from the power supply and dischargeable via the switch between the charge plate and the second ground plate;
- wherein the first ground plate is routed through a tester port, and the second ground plate is connected to a shield of the tester port, thereby providing two isolated contact points configured to be applied to a powered or unpowered port of a device under test (DUT).

18. An electrostatic discharge (ESD) pulse generator comprising:
- a capacitor stack including a first ground plate, a charge plate, and a second ground plate;
- a power supply electrically connected with the charge plate and the second ground plate;
- a current limiting resistor or switch electrically connected in series with the power supply and the charge plate; and
- a switch for electrically connecting the charge plate to the second ground plate;
- whereby the charge plate is chargeable from the power supply and dischargeable via the switch between the charge plate and the second ground plate;
- wherein the capacitor stack is modularized and includes multiple capacitor stacks that are selectively interchangeable for causing the ESD pulse generator to generate differently shaped transient current pulses.

19. The ESD pulse generator of claim 18, wherein:
- the first ground plate is routed through a center conductor of a coaxial connector; and
- the second ground plate is connected to a shield of the coaxial connector;
- whereby the ESD pulse generator is configured to be operable for generating a transient current pulse that is routed through a coaxial cable when connected with the coaxial connector without radiating unwanted electromagnetic interference (EMI).

20. An electrostatic discharge (ESD) pulse generator comprising:
- a first ground plate, a charge plate, and a second ground plate;
- a power supply electrically connected with the charge plate and the second ground plate;
- a current limiting resistor or switch electrically connected in series with the power supply and the charge plate; and
- a switch for electrically connecting the charge plate to the second ground plate;
- whereby the charge plate is chargeable from the power supply and dischargeable via the switch between the charge plate and the second ground plate;
- wherein the ESD pulse generator is configured such that output is isolated, whereby the ESD pulse generator is selectively operable for generating a positive transient current pulse or a negative transient current pulse by reversing connections.

21. A system comprising an electrostatic discharge (ESD) pulse generator, and a loop H-field or E-field near-field probe, wherein an output pulse of the ESD pulse generator is connected to the loop H-field or E-field near-field probe for generating electromagnetic interference usable for isolating and characterizing soft failures of a device under test (DUT); and wherein the ESD pulse generator comprises:
- a first ground plate, a charge plate, and a second ground plate;
- a power supply electrically connected with the charge plate and the second ground plate;
- a current limiting resistor or switch electrically connected in series with the power supply and the charge plate; and
- a switch for electrically connecting the charge plate to the second ground plate;
- whereby the charge plate is chargeable from the power supply and dischargeable via the switch between the charge plate and the second ground plate.

* * * * *